United States Patent [19]

Siddall

[11] Patent Number: 4,506,184

[45] Date of Patent: Mar. 19, 1985

[54] DEFORMABLE CHUCK DRIVEN BY PIEZOELECTRIC MEANS

[75] Inventor: Graham J. Siddall, Woodside, Calif.

[73] Assignee: Varian Associates, Inc., Palo Alto, Calif.

[21] Appl. No.: 569,632

[22] Filed: Jan. 10, 1984

[51] Int. Cl.$^3$ .............................................. H01L 41/08
[52] U.S. Cl. ........................................ 310/328; 279/3
[58] Field of Search ............. 310/311, 328; 279/1 W, 279/1 D, 3

[56] References Cited

U.S. PATENT DOCUMENTS 3,904,274  9/1975  Feinleib et al. ...................... 310/328
4,391,511  7/1983  Akiyama et al. ........................ 279/3

OTHER PUBLICATIONS

Three-Actuator Deformable Water-Cooled Mirror, by Fuschetto, SPIE, vol. 179, Adaptive Optical Components, 11, (1979), pp. 18–27.

Monolithic Piezoelectric Mirror for Wavefront Correction, by Feinleib et al, Applied Physics Letters, vol. 25, No. 5, Sep. 1974, pp. 311–313.

Primary Examiner—Mark O. Budd
Attorney, Agent, or Firm—Stanley Z. Cole; William R. McClellan

[57] ABSTRACT

A deformable vacuum pin chuck includes a thin silicon chuck for supporting a semiconductor wafer during lithographic processing and a number of piezoelectric transducers for selectively deforming the chuck. Chuck deformation caused by application of electric potentials to selected transducers may be used to correct flatness deviations in the wafer and, thereby, a desired degree of flatness of the semiconductor wafer may be obtained.

6 Claims, 2 Drawing Figures

DEFORMABLE CHUCK DRIVEN BY PIEZOELECTRIC MEANS

BACKGROUND AND SUMMARY OF THE INVENTION

Microlithographic systems are employed to allow creation of micron and sub-micron width patterns on semiconductor wafers during the processing of semiconductor devices. In such systems, particularly X-ray and optical lithography systems, control of wafer flatness is critical in order to achieve the desired widths. Wafer flatness of one micron or better is desirable for sub-micron lithography.

Conventional semiconductor wafers tend to be relatively flexible because of their large diameter to thickness ratios (approximately 150:1). This necessitates the use of highly specialized polishing techniques in order to achieve wafer flatness of 10 microns or better. Even with the use of such techniques, flatness deviations during high temperature processing are common.

It is known in the prior art to use extremely flat rigid vacuum chucks to hold down and flatten the wafer during lithographic exposure of the wafer. However, it is difficult to polish the chucks to the necessary flatness and to create wafers having the necessary uniformity of thickness to achieve the desired wafer flatness.

In accordance with the illustrated preferred embodiment of the present invention, a deformable vacuum chuck is mounted on a rigid base by a number of piezoelectric stacks (PZTs). An electric potential may be applied across selected PZTs in order to deform the chuck to compensate for flatness deviations in the wafer.

DETAILED DESCRIPTION OF THE PREFERRED EMBODIMENT

Figure 1:
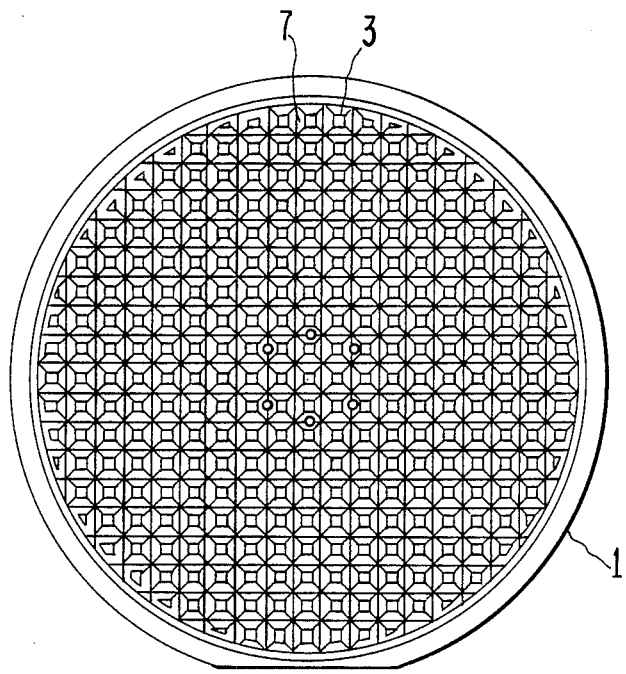
FIG. 1 shows a vacuum chuck which may be used in the preferred embodiment of the present invention.

FIG. 1 shows a chuck 1 which may be used in the preferred embodiment of the present invention. Chuck 1 is fabricated from a single silicon wafer as taught in the copending U.S. patent application Ser. No. 547,811, which was filed on Nov. 1, 1983, by Neukermans et al and which is incorporated by reference herein. Peaks 3 support a wafer 17 (shown in FIG. 2) which may be placed upon chuck 1. Valleys 7 define an air path so that a vacuum applied through a manifold 15 (shown in FIG. 2) may be used to hold the wafer 17 on chuck 1. Chuck 1 is 3 inches in diameter (for a 3 inch diameter wafer 17) and is 2 millimeters thick. Thus, chuck 1 has a diameter to thickness ratio of almost 40:1 and may be deformed by forces applied normal to the surface of chuck 1. Preferably, the chuck 1 has a diameter to thickness ratio greater than or equal to about 40:1.

Figure 2:
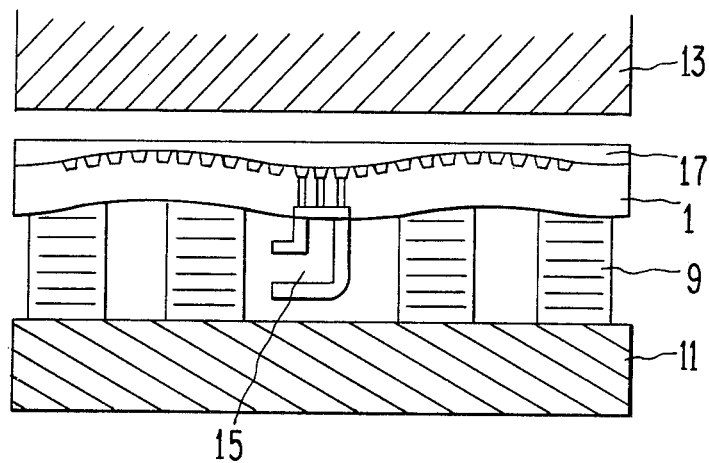
FIG. 2 shows an apparatus which is constructed in accordance with the preferred embodiment of the present invention.

FIG. 2 shows a cross-sectional view of an apparatus which is constructed in accordance with the preferred embodiment of the present invention. Chuck 1 is mounted on 19 uniformly distributed PZTs 9 which are themselves mounted on a rigid base plate 11. Application of an electrical potential across a selected PZT 9 causes a displacement of that selected PZT 9. Typically, PZTs 9 cause a displacement of 10 microns for an applied potential of 1000 volts.

In use, the wafer 17 is held in tight vacuum contact with the chuck 1 by application of a vacuum through manifold 15. In order to obtain a flat profile of wafer 17, comparison may be made to a reference flat 13 using optical interference or, alternatively, flatness may be measured using discrete capacitive or other displacement gauges. Appropriate voltages are applied to selected PZTs 9 to maximize the flatness of the surface of wafer 17. Further, the surface of wafer 17 may be compared to the surface of a mask, e.g. an X-ray mask during X-ray lithography, to achieve an exact gap spacing if the mask is not itself sufficiently flat.

Suitable sensors, such as strain gauges or displacement transducers, may be incorporated into chuck 1 so that the deformation of chuck 1 may be measured and duplicated at a later time. This permits closed loop control of the flatness of wafer 17 over a period of time.

I claim:

1. An apparatus for supporting a workpiece, comprising:
    a deformable chuck having a diameter to thickness ratio greater than or equal to about 40:1.
    a rigid plate; and
    a plurality of displacement means, mounted on the rigid plate and attached to the deformable chuck, for selectably displacing portions of the deformable chuck.

2. An apparatus as in claim 1, wherein each displacement means comprises a piezoelectric transducer.

3. An apparatus as in claim 2, wherein the deformable chuck comprises a single piece of crystalline matter.

4. An apparatus as in claim 3, wherein the deformable chuck further comprises:
    a plurality of peaks for supporting said workpiece, said peaks defining a plurality of valleys; and;
    a manifold for application of a vacuum through the valleys to hold the workpiece onto the peaks.

5. An apparatus as in claim 4, further comprising flatness means, coupled to the deformable chuck, for measuring the flatness thereof.

6. An apparatus as in claim 4, wherein the deformable chuck further comprises measurement means for measuring and recording the deformation thereof.

* * * * *